United States Patent [19]
Kim et al.

[11] Patent Number: 5,622,873
[45] Date of Patent: Apr. 22, 1997

[54] PROCESS FOR MANUFACTURING A RESIN MOLDED IMAGE PICK-UP SEMICONDUCTOR CHIP HAVING A WINDOW

[75] Inventors: Jin-Sung Kim; Gi-Rok Huh, both of Chungcheongbuk-do, Rep. of Korea

[73] Assignee: Goldstar Electron Co., Ltd., Cheongju, Rep. of Korea

[21] Appl. No.: 376,723

[22] Filed: Jan. 23, 1995

[30] Foreign Application Priority Data

Jan. 24, 1994 [KR] Rep. of Korea ................. 94-1209

[51] Int. Cl.⁶ ................. H01L 21/56; H01L 21/58; H01L 21/60
[52] U.S. Cl. ................. 438/65; 264/272.17; 438/116
[58] Field of Search ................. 437/2, 3, 211, 437/214, 219, 224, 212, 215, 216, 217; 264/272.17, 264; 257/434, 681, 707, 787, 100

[56] References Cited

U.S. PATENT DOCUMENTS

| | | | |
|---|---|---|---|
| 4,707,725 | 11/1987 | Ito | 357/72 |
| 4,894,707 | 1/1990 | Yamawaki et al. | 437/209 |
| 5,026,667 | 6/1991 | Roberts, Jr. | 437/209 |
| 5,424,249 | 6/1995 | Ishibashi | 437/211 |
| 5,438,216 | 8/1995 | Juskey et al. | 257/434 |

FOREIGN PATENT DOCUMENTS

| | | |
|---|---|---|
| 267750 | 3/1940 | Japan . |
| 59-84448 | 5/1984 | Japan . |
| 61-32535 | 2/1986 | Japan . |
| 62-115834 | 5/1987 | Japan . |
| 62-136053 | 6/1987 | Japan . |
| 40412751 | 5/1992 | Japan . |

*Primary Examiner*—John Niebling
*Assistant Examiner*—David E. Graybill
*Attorney, Agent, or Firm*—Alan R. Loudermilk

[57] ABSTRACT

A process for packaging a solid type image pick-up device and a device produced by the packaging process. The process includes the steps of: forming a protecting layer on a light receiving region of an image pick-up chip formed on a semiconductor wafer; separating the image pick-up chip after forming the protecting layer; attaching the image pick-up chip on a lead frame and connecting leads of the lead frame to a pad of the separated image pick-up chip; sealing the chip within a chip-receiving body by molding with a resin and by using a mold having a projection, the projection extending to the protecting layer; and removing the protecting layer, and sealing a transparent plate on a cavity formed by the projection.

18 Claims, 3 Drawing Sheets

PROCESS FOR MANUFACTURING A RESIN MOLDED IMAGE PICK-UP SEMICONDUCTOR CHIP HAVING A WINDOW

FIELD OF THE INVENTION

The present invention relates to a solid type image pick-up device and a manufacturing process therefor, and more particularly to a device and process in which a protecting layer is formed on a light-receiving region of an image pick-up chip, and a molding and packaging is carried out, thereby saving manufacturing cost, and improving process reliability and productivity.

BACKGROUND OF THE INVENTION

In a solid type image pick-up device which is used in video cameras and the like, an optical image has to be formed on the image pick-up device in an accurate manner.

In a conventional image pick-up device, as illustrated in FIG. 1, an image pick-up chip 13 is attached on a chip-attaching region of chip receiving vessel 11 which has signal terminals 16 to be connected to pads (not illustrated) of image pick-up chip 13. Signal terminals 16 are connected to the pads of the image pick-up chip with bonding wires 15. Transparent glass plate 14 which has a window of a light receiving surface, which surface consists of a glass plate having the usual optical flatness, is secured on the vessel by sealant 17 to protect the image pick-up chip. In the drawing, reference code 13a indicates a light receiving portion, and reference code 12 indicates leads.

As to the process of manufacturing the solid type image pick-up device packaged in the form of the above described structure, at first a wafer fabrication step is carried out to form image pick-up chips having light receiving sections on the chip. These chips are separated, and the separated chips are aligned and attached on a chip-attaching region which lies in a cavity of chip-receiving vessel 11, chip-receiving vessel 11 being formed by sintering in advance. The chips are attached on the chip-attaching region of the chip-receiving vessel by using epoxy adhesive 18. Signal terminals 16 of the receiving vessel are wire-bonded to each of the chip pads, respectively.

Glass plate 14 on which a sealant is spread is attached on the top surface of the chip-receiving vessel, and external terminals are trimmed, thereby completing the product.

Chip-receiving vessel 11 has to have the signal terminals inside of it, and thus upper and lower ceramic plates are formed by applying a sintering process.

The solid type image pick-up device is manufactured in the above described method. However, the sintered ceramic plates embody more than 60% of the total cost of the device, and the sintering of the ceramic plates is handled as an individual step of the process, thereby lowering the productivity for the package.

Further, no particles may exist on the surface of the light-receiving region (window) during the assembling, with the result that it becomes difficult to carry out the process, as well as aggravating the yield. Particularly, achieving compactness becomes difficult.

SUMMARY OF THE INVENTION

The present invention is intended to overcome the above described disadvantages of the conventional technique.

It is an object of the present invention to provide a solid type image pick-up device and a packaging process therefor in which the package is formed using plastic or resin having a superior formability and by applying a transfer molding method so as to lower the price thereof, and further a series of molding processes are adopted so as to achieve compactness of the package and so as to facilitate mass production and so as to improve productivity, and, further, the protected light-receiving region is separately treated during the molding so as to prevent contamination of the light-receiving region.

In achieving the above object, the process for manufacturing or packaging the solid type image pick-up device according to the present invention includes the steps of: forming a protecting layer on a light-receiving region of an image pick-up chip formed on a semiconductor wafer; separating the image pick-up chip after forming the protecting layer, connecting leads of a lead frame to the pad of the separated image pick-up chip, sealing the chip within a chip-receiving body by molding with a resin and by using a mold having a projection, the projection contacting to the protecting layer; and removing the protecting layer, and sealing a transparent plate on a cavity formed by the projection. The mold is divided into a lower mold and an upper mold for forming a cavity. The upper mold has a first projection and a second projection which contacts with the protecting layer. After the molding, the chip-receiving body has a cavity corresponding to the second projection, and has a transparent plate receiving portion corresponding to the first projection.

The solid type image pick-up device manufactured by the above described process includes: an image pick-up chip having a light-receiving region; a chip-receiving body with the chip sealed therein through a resin-molding; a cavity for exposing the light-receiving region on the chip-receiving body; and a transparent plate sealed at a position corresponding to the light-receiving region of the chip-receiving body. Further, the cavity includes another flat receiving portion, and the transparent plate is disposed on the flat receiving portion, so that the chip-receiving body may include plural transparent plates.

According to another aspect of the present invention, the process includes the steps of: bonding a pad and a light-receiving region to a chip-attaching portion of a lead frame; wire-bonding a pad to the lead frame; sealing the chip within a chip-receiving body by resin-molding and by using a mold having a projection, the projection having a step for contacting with the chip surface, the chip surface including the light-receiving region; and sealing a transparent plate onto the cavity of the chip-receiving body, the cavity corresponding to the projection.

According to another aspect of the present invention, the image pick-up device includes: an image pick-up chip having a light-receiving region; a chip-receiving body with the chip sealed thereon by resin-molding; a cavity formed in such a manner as to expose the light-receiving region on the chip-receiving body; and a transparent plate sealed at a position corresponding to the light-receiving region of the top of the chip-receiving body.

The cavity of the chip-receiving body consists of: a first cavity formed between the transparent plate and the light-receiving region of the chip; and a second cavity having a stepped surface and communicating with the first cavity. The transparent plate is attached on the surface of the second cavity, and the first cavity consists of a space through which the light incident through the transparent plate is transferred to the light-receiving region.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

Figure 1:
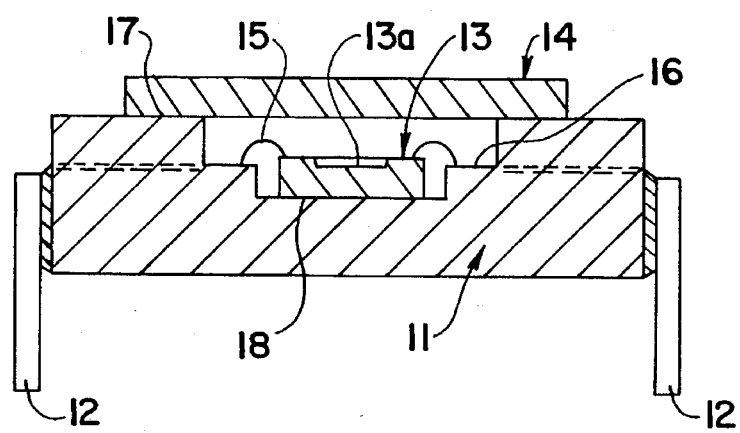
FIG. 1 is a sectional view of a conventional image pick-up device.
Figure 2A:
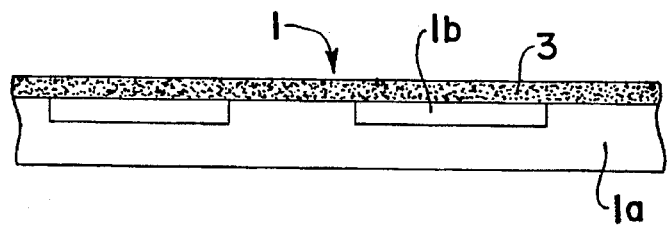
FIGS. 2A to 2F are sectional views illustrating a resin-molding process for manufacturing the image pick-up device according to the present invention.

The image pick-up chips are formed through a wafer fabrication process. That is, as illustrated in FIG. 2A, the image pick-up chips are formed by forming light-receiving region 1b on semiconductor substrate 1a, thereby forming a plurality of chips on one wafer. Under this condition, in order to apply the present invention, light-receiving region protecting layer 3 is formed on the whole surface of the substrate before carrying out a chip separation.

Figure 2B:
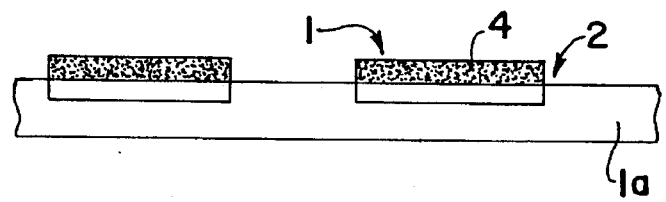
Figure 3:
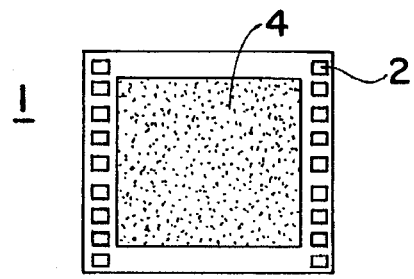
FIG. 3 is a plan view corresponding to FIG. 2A.

The light-receiving region protecting layer protects the light-receiving region from contamination during the process of the present invention. In this embodiment, the protecting layer is formed by using a solid type photo resist, and is patterned through exposure and development as illustrated in FIG. 2B, which exposes pad portion 2 of the chip. The individual structure of the chip is as illustrated in FIG. 3 in an plan view. In FIG. 3, reference numeral 1 indicates a chip, 4 indicates a patterned protecting layer or a photo resist pattern, and 2 indicates a pad.

A sawing operation is carried out, so that the plurality of the chips may be separated from the wafer.

Figure 2C:
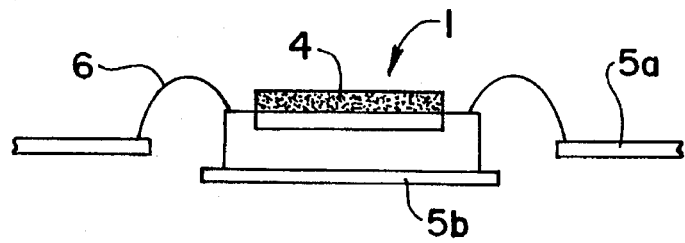

A separated image pick-up chip is attached on a chip-attaching portion of a lead frame (which is made ready in advance) using a proper technique known in the art. An inner lead of the lead frame is connected to the chip pad by applying a wire bonding method. FIG. 2C illustrates chip 1 attached on chip attaching portion 5b of the lead frame, and also illustrates the connection of inner lead 5a of the lead frame to the chip pad through wire 6. Here, wire 6 is made of gold or aluminum.

Figure 4:
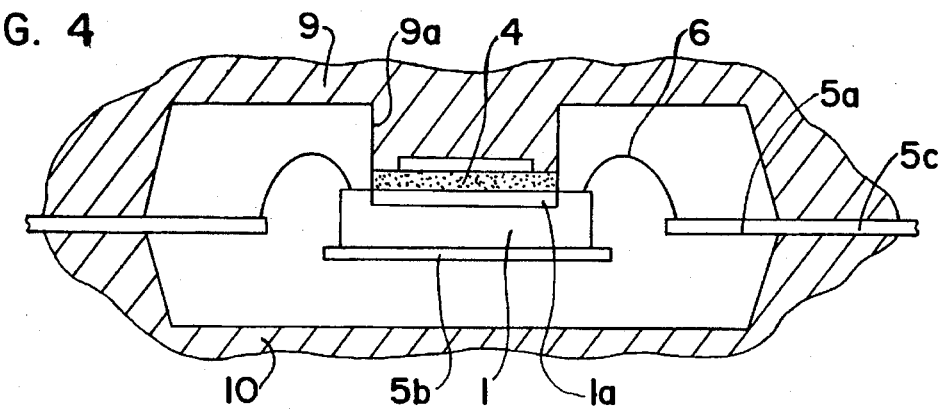
FIG. 4 illustrates a resin-molding process according to the present invention.

A molding process is carried out by sealing the chip through the use of a resin. In order to carry out this process, as illustrated in FIG. 4, the chip which is wire-bonded to the lead frame is disposed within a cavity which is formed by upper mold 9 and lower mold 10 (see e.g., FIG. 4). Then, resin is injected into the cavity, and the injected resin is solidified (cured). Thus, chip receiving body 7 is formed, and the chip is sealed.

Figure 2D:
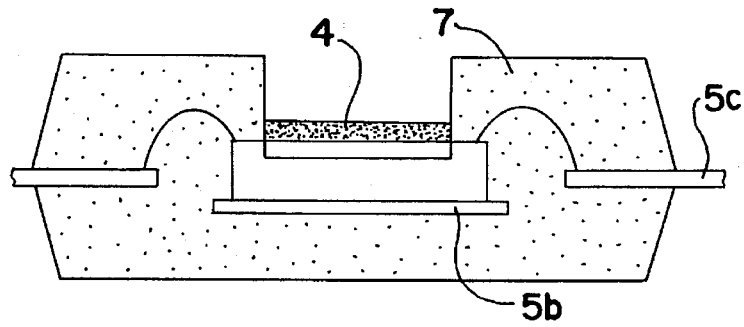

As illustrated in FIG. 4, upper mold 9 forms a cavity and has projection 9a. Projection 9a of upper mold 9 is mated with protecting layer 4 on the chip. The reason is that the upper face of the protecting layer may not be coated with the resin. Owing to the projection, chip-receiving body 7 seals the whole chip but excluding protecting layer 4 as illustrated in FIG. 2D, and outer lead 5c of the lead frame is exposed to the outside of the chip-receiving body.

As can be seen in the above described process, the material for packaging is a resin or a plastic, and, therefore, the cost may be reduced as compared with the case in which ceramic is used. Further, when the molding is carried out using a resin, the protecting layer is formed to prevent contamination of the light-receiving region, thereby protecting the light-receiving region. The process is carried out without modifying existing facilities, and the ceramic case is not used, unlike the conventional method, thereby improving the productivity.

Figure 2E:
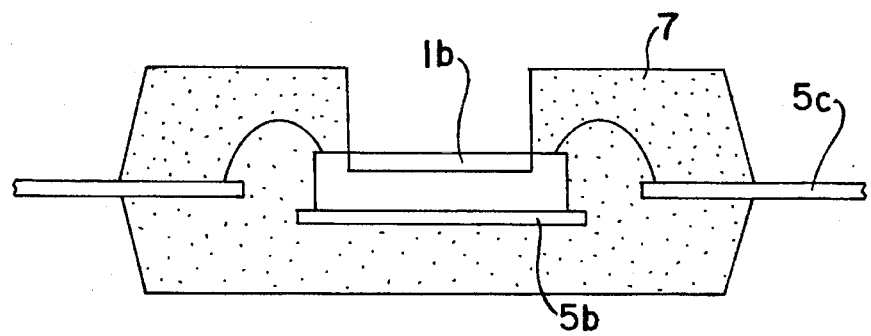
Figure 2F:
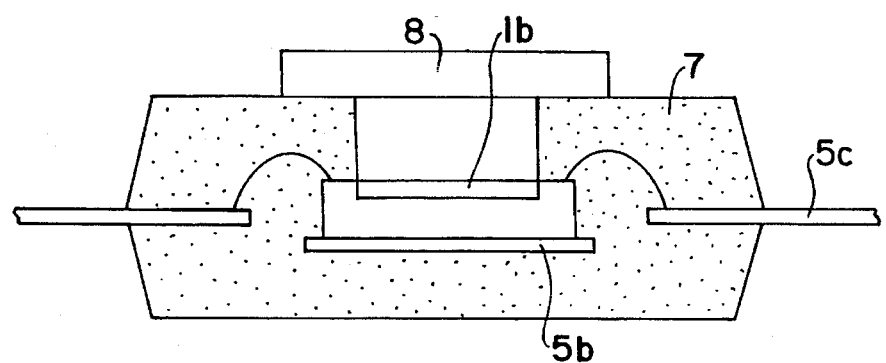

As illustrated in FIG. 2E, the photo resist which has been used for protecting the light-receiving region is removed by a chemical method such as a dry etching or the like. Thus the light-receiving region is opened, and a cavity is formed on the light-receiving region, so that light beams may pass through the cavity to the light-receiving region. As illustrated in FIG. 2F, transparent glass plate 8, which has a transmittance of over 90% and a refractive index of over 1.5, and on which a low melting point sealant is spread, is sealed on chip-receiving body 7, thereby forming a solid type image pick-up device. Thus, the manufacturing of the product may be completed based on the standard plastic package process.

The solid type image pick-up device manufactured based on the process of the present invention is as illustrated in FIG. 2F. The solid type image pick-up device includes: an image pickup chip having light-receiving region 1b; chip-receiving body 7 with a chip sealed therein by means of resin-molding; a cavity for exposing the light-receiving region on the chip-receiving body; and transparent plate 8 sealed at a position corresponding to the light-receiving region of the top face of the chip-receiving body.

Figure 5:
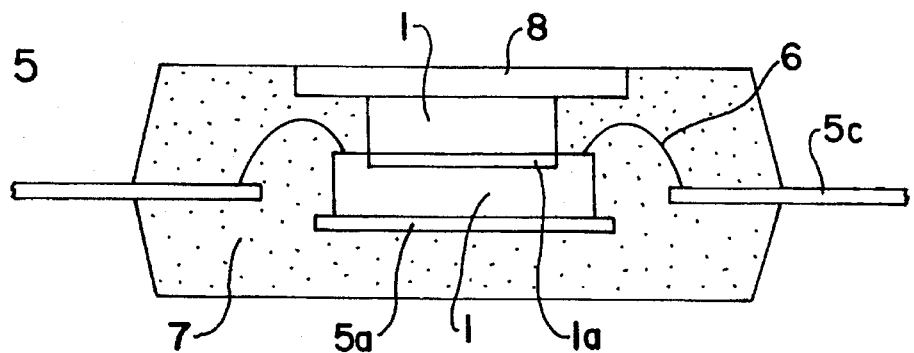
FIG. 5 is a sectional view illustrating another embodiment of a resin-molding process according to the present invention.

A modified structure of the image pick-up device according to the present invention is as illustrated in FIG. 5. The modified features are as follows. That is, the transparent plate which was sealed on the top face of the chip-receiving body in the previous embodiment is included within the chip-receiving body in the present embodiment. In order to achieve this feature, the projection of the mold of FIG. 4 is divided into first and second projections, and resin-molding is carried out.

Transparent plate 8 is sealed, as illustrated in FIG. 5, within the first cavity of the transparent plate-receiving portion which is formed by the first projection of the mold. The second cavity which corresponds to the second projection of the mold remains as a space through which light beams pass to the light-receiving region. The first and second cavities communicate with each other. The transparent plate is disposed on the transparent plate-receiving portion, and, therefore, it is desirable that the thickness of the first projection of the mold may be the same as the thickness of the transparent plate.

Therefore, the top of the chip receiving body is just flat without any protrusion, unlike the previous embodiment, whereby the handling becomes more convenient.

Still another embodiment of the image pick-up device according to the present invention will be described. In this embodiment, the same reference numerals will be assigned for the parts analogous to those of the previous embodiments.

The previous two embodiments are first and second embodiments, and the present embodiment is a third embodiment. This third embodiment is similar in certain respects to the previous two embodiments, and the process will be described below in detail.

According to the third embodiment of the present invention, a wafer process is carried out in such a manner that there are formed a plurality of light-receiving regions on a semiconductor substrate, thereby forming a plurality of chips on the wafer. A sawing process is carried out, and thereby a chip is obtained from a wafer.

The separated chip is attached to a chip-attaching portion by using a proper adhesive means. An inner lead of the lead frame is wire-bonded to the chip pad.

Figure 6:
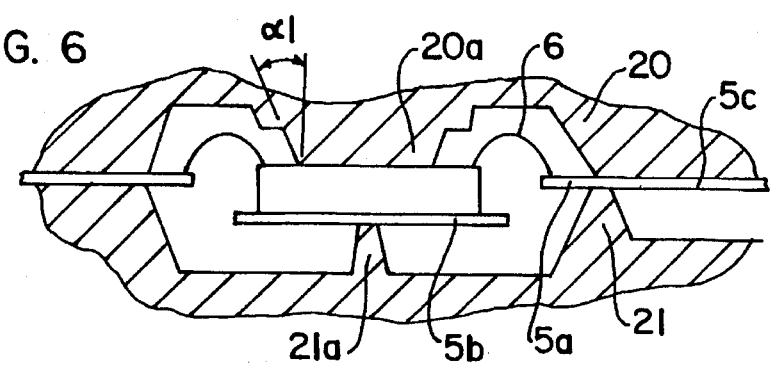
FIG. 6 illustrates still another embodiment of a resin-molding process according to the present invention.

FIG. 6 is a sectional view illustrating a state in which the bonding and wire bonding have been carried out. The wire is made of gold or aluminum. FIG. 6 also illustrates the molding process, and this will be described further below.

The mold for carrying out a transfer molding process consists of upper mold 20 and lower mold 21, and the two molds form a cavity. The chip is inserted into the cavity, and resin is injected into the cavity and cured.

Stepped projection 20a of upper mold 20 contacts with the light-receiving region, and the output of the projection is diverged upward with an angle $\alpha_1$. This projection forms a cavity which exposes later the light-receiving region, while this projection is given a slope of an angle $\alpha_1$, thereby making receipt of the light beams more efficient.

Figure 8:
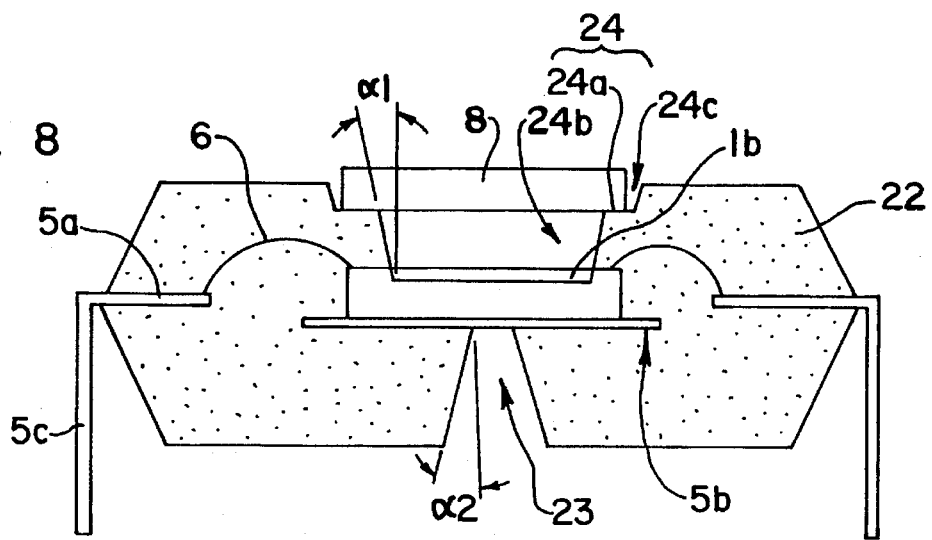
FIG. 8 is a sectional view illustrating the image pick-up device formed based on a method including the process of FIG. 6.

Projection 21a of lower mold 21 supports the chip, and resin is injected into the cavity in which the chip is disposed on projection 20a of upper mold 20 and projection 21a of lower mold 21. As illustrated in FIG. 8, the solidified resin forms chip receiving body 22, and cavity 24 is formed by the stepped projection, while the projection of the lower mold forms tapered groove 23 as observed from the outside. The bottom of tapered groove 23 has a shape similar to that of the rear side of the chip attaching portion of the lead frame, and the taper has an angle $\alpha_2$.

Transparent glass plate 8 is attached on surface 24a which is formed on a stepped projection. The whole of cavity 24 which begins from projection 20a of the mold includes: first cavity 24b formed between the transparent plate and the light-receiving region of the chip; and second cavity 24c having a stepped surface and communicating with the first cavity. The transparent plate is placed in the second cavity, while the first cavity is a space through which light beams pass to the light-receiving region after passing through the transparent plate.

Figure 7:
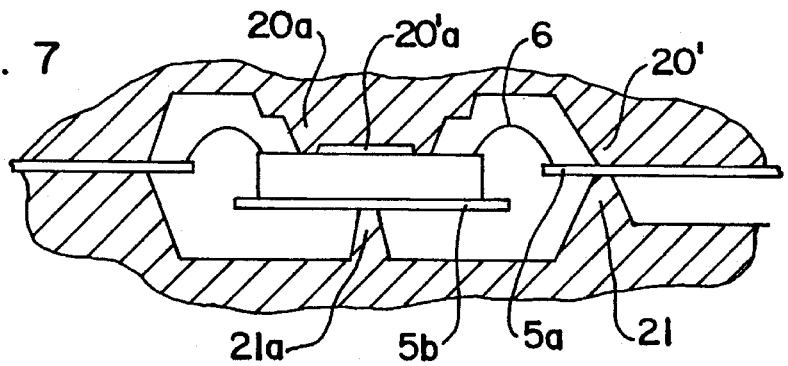
FIG. 7 illustrates a modified case of the resin-molding process of FIG. 6.

Meanwhile, in a fourth embodiment as illustrated in FIG. 7, instead of stepped projection 20a of upper mold 20 in a third embodiment, upper mold 20'is provided with groove 20'a at the bottom of stepped projection 20a, which groove 20'a is positioned between the light-receiving region of the chip and the stepped projection, and thus the upper mold 20' does not contact with the light-receiving region. The packaging process is the same as that of the above-described third embodiment.

According to the present invention as described above, the package of the solid type image pick-up device is formed not by a ceramic, but instead by using a plastic or resin. Therefore, the cost is reduced, and the productivity is improved, because a series of steps are used in packaging. Further, since the protective layer is removed after the molding, contamination which may occur during the process is prevented.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for manufacturing an image pick-up device, comprising the steps of:

forming a protecting layer comprising a photo-sensitive material on a light-receiving region of an image pick-up chip formed on a semiconductor wafer;

separating the image pick-up chip from the wafer after forming the protecting layer;

attaching the image pick-up chip on a lead frame and connecting the leads of the lead frame to pads of the separated image pick-up chip;

sealing the chip within a chip-receiving body by molding with a resin and by using a mold having a projection, the projection extending to the protecting layer and forming a cavity over the protecting layer; and removing the protecting layer, and sealing a transparent plate on the cavity formed by the projection.

2. The process of claim 1, wherein the protecting layer comprises photo resist.

3. The process of claim 1, wherein the protecting layer is formed on the wafer, wherein the wafer has a plurality of image pick-up chips formed therein, and a patterning is carried out with a photo-etching process so as for remaining portions of the protecting layer to cover the light-receiving regions of the image pick-up chips.

4. The process of claim 1, wherein the lead frame comprises a chip-attaching portion, an inner lead, and an outer lead connected to the inner lead, wherein the image pick-up chip is attached to the chip-attaching portion, and the image pick-up chip includes pad that is wire-bonded to the inner lead.

5. The process of claim 1, wherein the mold consists of an upper mold and a lower mold for forming a cavity; and the upper mold is provided with a first projection and a second projection connected to the first projection and extending to the protecting layer of the image pick-up chip; and a molded chip-receiving body includes a cavity corresponding to the second projection, and a plate-receiving portion corresponding to the first projection.

6. The process of claim 5, wherein the thickness of the first projection corresponds to the thickness of the transparent plate.

7. The process of claim 5, wherein the transparent plate is placed on the plate-receiving portion and sealed with a sealant.

8. A process for manufacturing an image pick-up device, comprising the steps of:

bonding an image pick-up chip on a chip-attaching portion of a lead frame, the image pick-up chip having pads and a light-receiving region and a photo-sensitive protecting layer formed by a photo-etch process and extending over the light-receiving region but not the pads;

wire-bonding the pads to leads of the lead frame;

sealing the image pick-up chip within a chip-receiving body by resin-molding using a mold having a projection for contacting with the protecting layer; and sealing a transparent plate onto the cavity of the chip receiving body, the cavity corresponding to the projection.

9. The process of claim 8, wherein the stepped projection contacting with the protecting layer is provided with a groove, wherein the groove has a size that corresponds to the light-receiving region and wherein the light-receiving region does not contact with the projection.

10. The process of claim 8, wherein the cavity corresponding to the projection comprises:

a first cavity formed between the light-receiving region of the image pick-up chip and the transparent plate; and a second cavity having a stepped surface and communicating with the first cavity;

wherein the transparent plate is positioned inside of the second cavity, and the first cavity forms a space for transferring light beams incident on the transparent plate to the light-receiving region.

11. The process of claim 8, wherein the cavity has an angle diverged toward the outside of the chip-receiving body.

12. A process for manufacturing an image pick-up device, comprising the steps of:

bonding an image pick-up chip on a chip-attaching portion of a lead frame, the image pick-up chip having pads and a light-receiving region;

wire-bonding the pads to leads of the lead frame;

sealing the image pick-up chip within a chip-receiving body by resin-molding using a mold having a projection provided with a groove, wherein the groove has a size and position that correspond to the light-receiving region, wherein the light-receiving region does not contact with the projection; and sealing a transparent plate onto the cavity of the chip receiving body, the cavity corresponding to the projection.

13. The process of claim 12, wherein the image pick-up chip has a protecting layer formed to extend over the light-receiving region but not the pads.

14. The process of claim 13, wherein the protecting layer is removed prior to sealing of the transparent plate.

15. The process of claim 13, wherein the protecting layer comprises a photo-sensitive material.

16. The process of claim 15, wherein the photo-sensitive material comprises photo-resist.

17. The process of claim 12, wherein the cavity corresponding to the projection comprises:

a first cavity formed between the light-receiving region of the image pick-up chip and the transparent plate; and a second cavity having a stepped surface and communicating with the first cavity;

wherein the transparent plate is positioned inside of the second cavity, and the first cavity forms a space for transferring light beams incident on the transparent plate to the light-receiving region.

18. The process of claim 12, wherein the cavity has an angle diverged toward the outside of the chip-receiving body.

* * * * *